United States Patent
Sakurai et al.

(10) Patent No.: US 8,334,913 B2
(45) Date of Patent: Dec. 18, 2012

(54) ANALOG-TO-DIGITAL CONVERTER CIRCUIT AND SOLID-STATE IMAGING DEVICE

(75) Inventors: Satoshi Sakurai, Kawasaki (JP); Kenichi Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 12/834,270

(22) Filed: Jul. 12, 2010

(65) Prior Publication Data

US 2011/0013058 A1 Jan. 20, 2011

(30) Foreign Application Priority Data

Jul. 14, 2009 (JP) ................................. 2009-165932

(51) Int. Cl. *H04N 5/217* (2011.01)
(52) U.S. Cl. ........................................ 348/241; 341/169
(58) Field of Classification Search .................. None
See application file for complete search history.

(56) References Cited

U.S. PATENT DOCUMENTS

| 2008/0111059 A1* | 5/2008 | Lee et al. ............... 250/214 DC |
| 2010/0103017 A1* | 4/2010 | Sakurai ....................... 341/155 |
| 2010/0207798 A1* | 8/2010 | Lim et al. ...................... 341/155 |
| 2010/0225796 A1* | 9/2010 | Lim et al. ...................... 348/308 |

FOREIGN PATENT DOCUMENTS

JP 2005-303648 10/2005

OTHER PUBLICATIONS

Woodward Yang, et al., "An Integrated 800x600 CMOS Imaging System", ISSCC Digest of Technical Papers, Feb. 1999, pp. 304-305 and 471.

* cited by examiner

*Primary Examiner* — Nelson D. Hernández Hernández
*Assistant Examiner* — Dennis Hogue
(74) *Attorney, Agent, or Firm* — Oblon, Spivak, McClelland, Maier & Neustadt, L.L.P.

(57) ABSTRACT

Certain embodiments provide an ADC includes a comparator, a binary counter and a control circuit. The comparator compares a first analog signal voltage with a first reference voltage, and compares a second analog signal voltage with a second reference voltage. The binary counter counts up the clock signal for a first period until the first reference voltage becomes equal to the first analog signal after the comparator starts to compare the first reference voltage with the first analog signal voltage, and inverts a logic level of the count output having a plurality of bits after the first period elapses. The binary counter counts up the clock signal for a second period until the second reference voltage becomes equal to a second analog signal after the comparator starts to compare the second reference voltage with the second analog signal voltage.

14 Claims, 8 Drawing Sheets

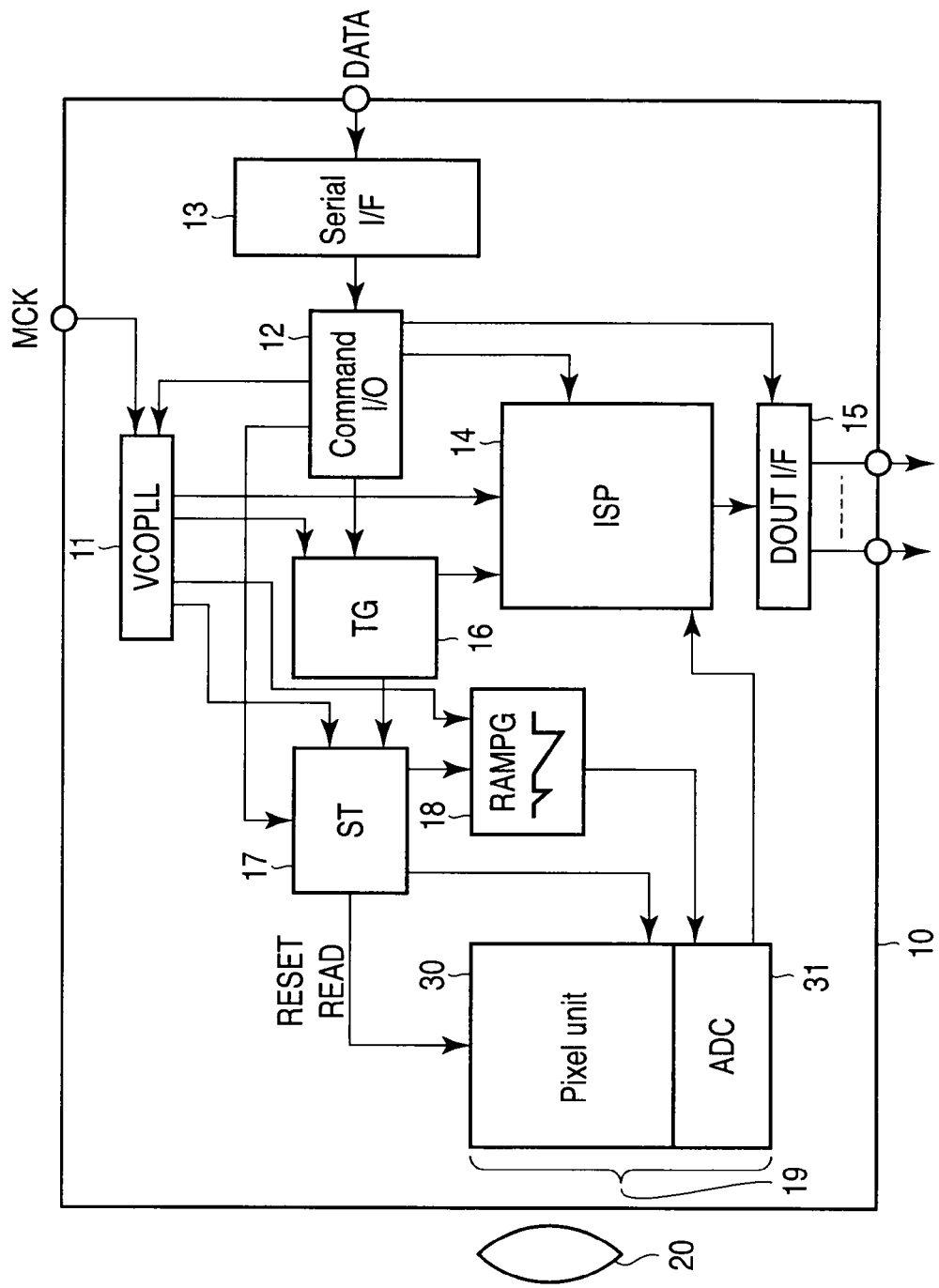
F I G. 1

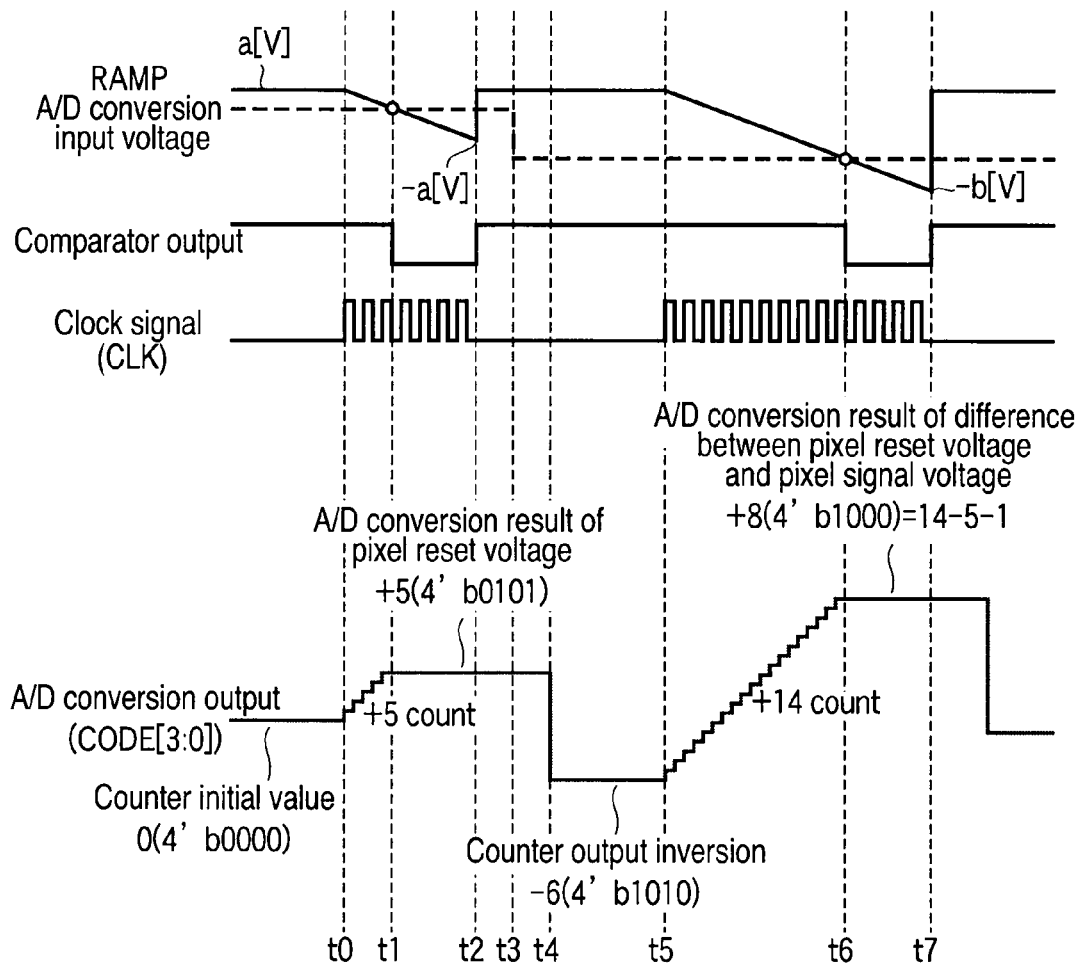
F I G. 4

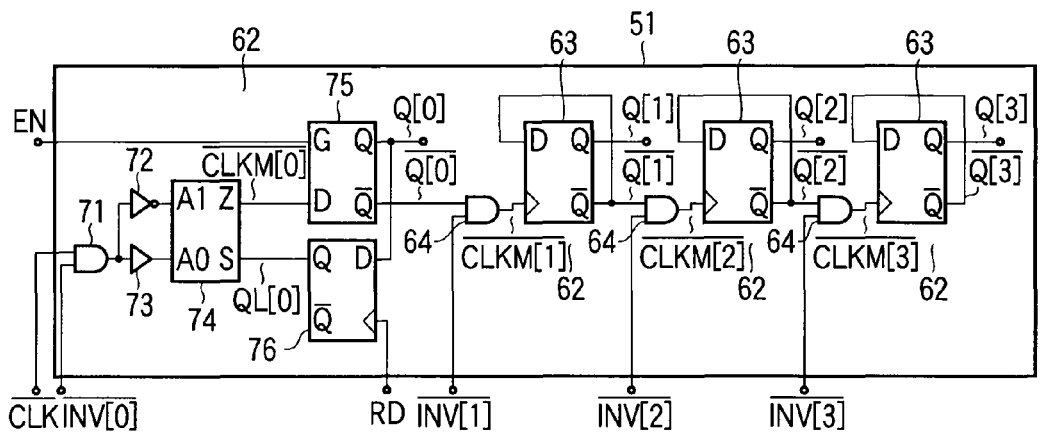
F I G. 9
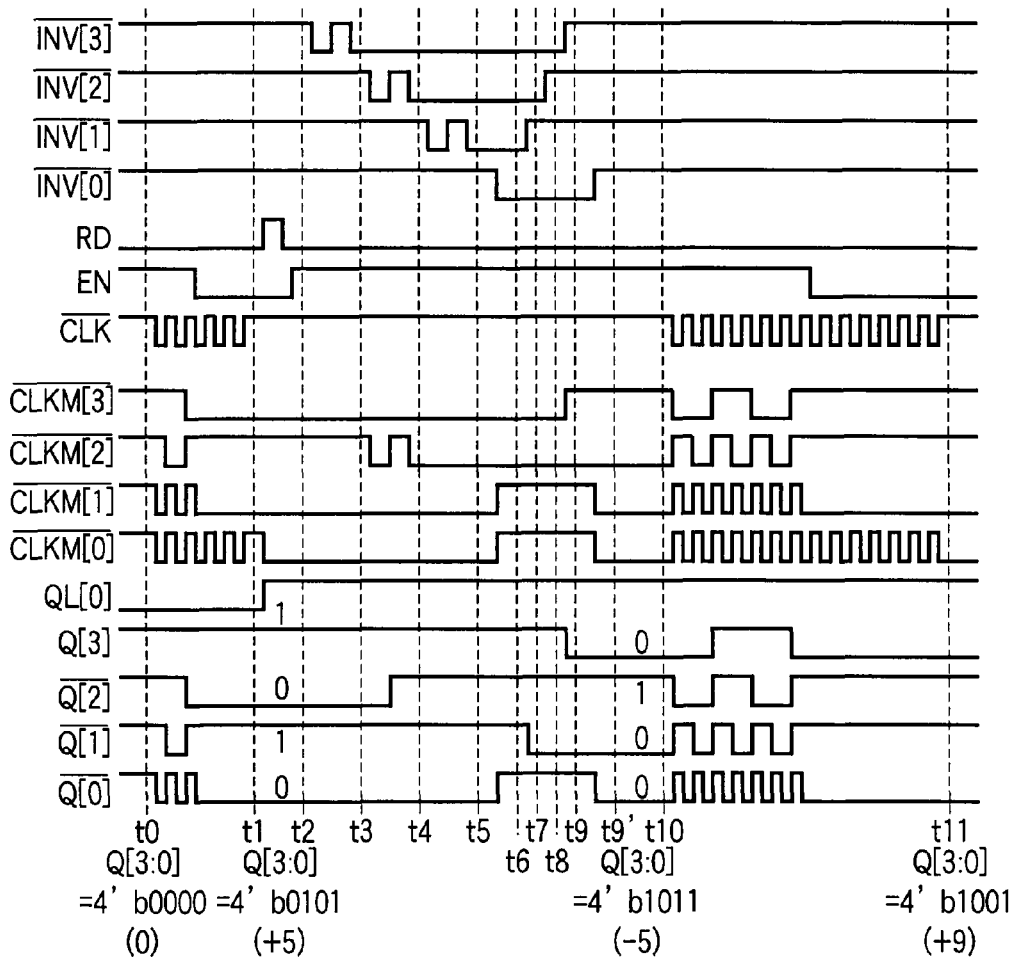
F I G. 10

ANALOG-TO-DIGITAL CONVERTER CIRCUIT AND SOLID-STATE IMAGING DEVICE

CROSS-REFERENCE TO RELATED APPLICATIONS

This application is based upon and claims the benefit of priority from Japanese Patent Application No. 2009-165932, filed Jul. 14, 2009; the entire contents of which are incorporated herein by reference.

FIELD

Embodiments described herein relate generally to an analog-to-digital converter circuit, which converts a video signal read from a pixel, and to a solid-state imaging device.

BACKGROUND

The following method has been known as one of analog-to-digital conversions (A/D conversion) of converting a pixel signal read from a CMOS image sensor to a digital signal. According to this A/D conversion method, a counter takes a count until a signal voltage read from a pixel unit and a reference voltage, which is generated by a reference voltage generator circuit and changes at a predetermined gradient with the time elapse, become the same value. In this way, a video signal is converted to a digital signal (A/D conversion). Specifically, the potential difference between a video signal voltage read from a pixel unit and a reset voltage given as a reference of the video signal voltage is digitized (A/D conversion). However, the foregoing A/D conversion method has the following problem; namely, when the foregoing potential difference is sampled, a thermal noise resulting from sampling occurs.

An A/D conversion method for removing the influence by the foregoing thermal noise is disclosed in the following document.

Document: Woodward. Yanget et al., "An Integrated 800× 600 CMOS Imaging system," 1999 IEEE international Solid-state Circuit Conference. Digest of Technical Papers, 1999 February, pp. 304-305.

The A/D conversion method disclosed in the foregoing document is as follows. Specifically, a reset voltage is A/D-converted using a reference voltage output from a reference voltage generator circuit. Thereafter, a video signal voltage is digitized (A/D conversion) using the reference voltage likewise, and then, the difference between the foregoing two A/D conversion results is obtained as the final A/D conversion value. However, according to this A/D conversion method, a register for storing two-time A/D conversion results is required; for this reason, the circuit scale becomes large.

Moreover, Jpn. Pat. Appln. KOKAI Publication No. 2005-303648 discloses a method of realizing an operation for the difference of two-time A/D conversions using an up-down counter. According to this method, two-time A/D conversions, storage of A/D conversion results and a difference operation are performed using one up-down counter. Specifically, A/D conversion of a reset voltage is carried out in a down-count mode, and thereafter, a counter is changed to an up-count mode, and thus, A/D conversion of a video signal is carried out in the up-down mode. Then, the final counter output value is equivalent to the difference of the video signal and the reset signal. The foregoing method is employed, and thereby, there is no need to provide a register; therefore, the circuit scale is reduced. However, an up-down counter is required, and the number of elements increases compared with the case of using a simple binary counter; as a result, the area of an ADC increases.

BRIEF DESCRIPTION OF THE DRAWINGS

FIG. 1 is a block diagram showing the configuration of a solid-state imaging device according to a first embodiment;

FIG. 4 is a waveform chart showing one example of the operation of the ADC shown in FIG. 2;

FIG. 9 is a circuit diagram showing the detailed configuration of a binary counter used for an ADC and a solid-state imaging device according to a second embodiment; and FIG. 10 is a timing chart to explain one example of an operation of the binary counter shown in FIG. 9.

DETAILED DESCRIPTION

Figure 2:
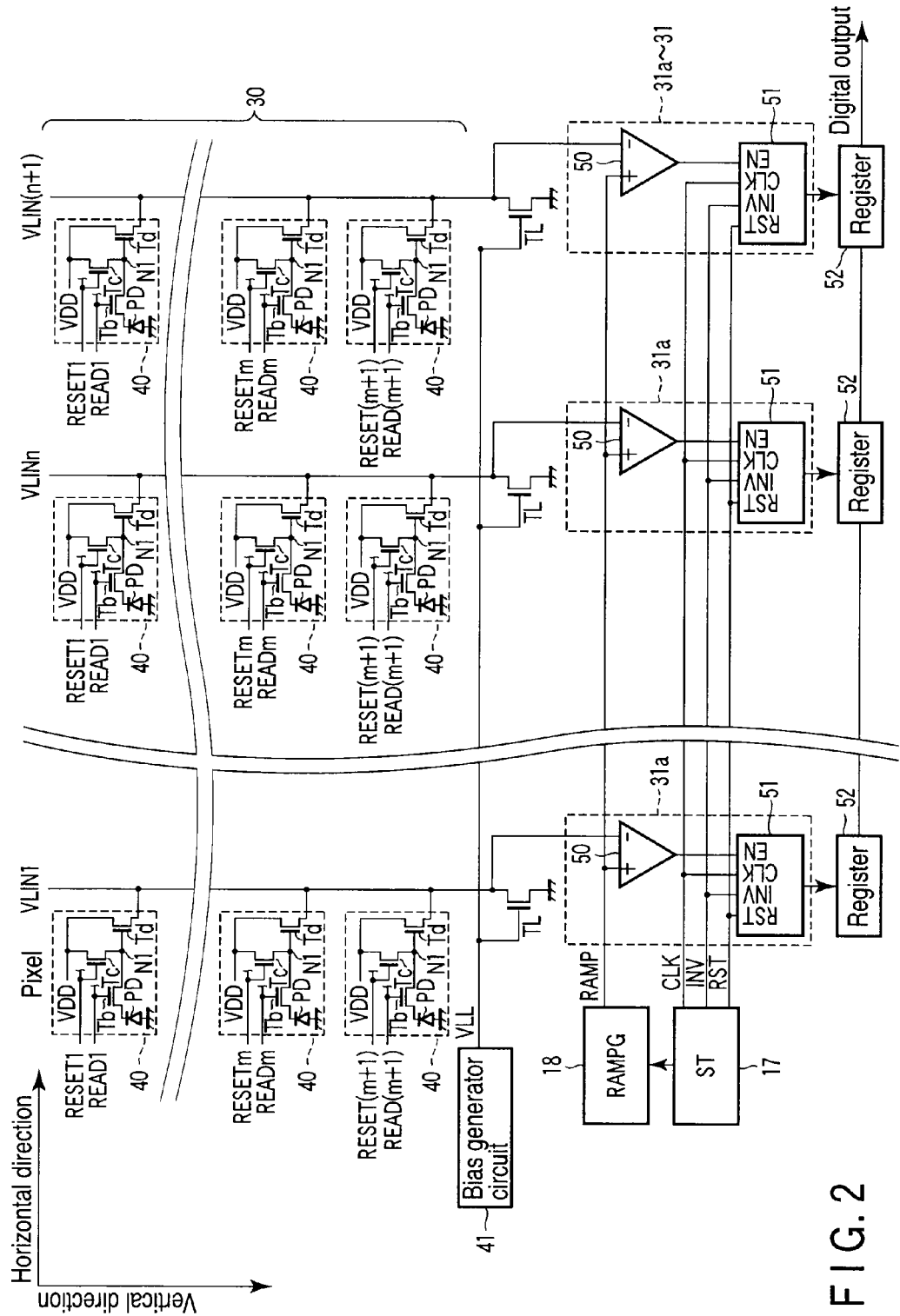
FIG. 2 is a circuit diagram showing the configuration of a sensor core unit of the solid-state imaging device shown in FIG. 1.

In general, according to one embodiment, an analog-to-digital converter (ADC) includes a comparator, a binary counter and a control circuit. The comparator compares a first analog signal voltage with a first reference voltage, which changes at a constant gradient from a first voltage larger than the first analog signal voltage to a voltage smaller than the first analog signal voltage. Further, the comparator compares a second analog signal voltage with a second reference voltage, which changes at a constant gradient from a second voltage larger than the second analog signal voltage to a voltage smaller than the second analog signal voltage. The binary counter receives an output signal of the comparator and a clock signal, and counts the clock signal based on the output signal of the comparator to generate a count output having a plurality of bits. Further, the binary counter counts the clock signal for a first period until the first reference voltage becomes equal to the first analog signal after the comparator starts to compare the first reference voltage with the first analog signal voltage, and inverts a logic level of the count output having a plurality of bits after the first period elapses. Furthermore, the binary counter counts the clock signal for a second period until the second reference voltage becomes equal to a second analog signal after the comparator starts to compare the second reference voltage with the second analog signal voltage. Then, the binary counter outputs a count output having a plurality of bits after the second period elapses as a conversion result of the potential difference between the first and second analog signal voltages. The control circuit executes the control to invert a logic level of the count output.

Various embodiments will be hereinafter described with reference to the accompanying drawings. In the following description of various embodiments, the same reference numerals are used to designate the corresponding portions, and the overlap explanation is omitted.

First Embodiment

FIG. 1 is a block diagram showing the whole configuration of a solid-state imaging device according to a first embodiment. Hereinafter, a CMOS image sensor will be explained as one example. As shown in FIG. 1, a solid-state imaging device 10 includes a clock control circuit (hereinafter, referred to VCOPLL) 11, a serial command input/output unit 12, a serial interface (hereinafter, serial I/F) 13, and an image signal processing circuit (hereinafter, referred to as ISP) 14. Further, the device 10 includes a data output interface (hereinafter, referred to as DOUT I/F) 15, a reference timing generator circuit (hereinafter, referred to as TG) 16, a sensor drive timing generator circuit (hereinafter, referred to as ST) 17. Furthermore, the device 10 includes a ramp wave voltage (RAMP) generator circuit (hereinafter, referred to as RAMPG) 18, a sensor core unit 19 and a lens unit 20. The sensor core unit 19 includes a pixel unit 30 and an analog-to-digital (A/D) converter circuit (hereinafter, referred to as ADC) 31 provided adjacent thereto.

The foregoing circuits and units shown in FIG. 1 will be detailedly explained below. The VCOPLL 11 generates various clock signals used inside the solid-state imaging device 10 based on a master clock signal MCK. The master clock signal MCK is generated based on an output signal of an oscillator circuit including a quartz oscillator, which is arranged outside the solid-state imaging device 10. The frequency of internal clock signals is controlled by the VCOPLL 11.

The serial I/F 13 externally receives control data DATA for operating the whole system of the solid-state imaging device 10 including the ISP 14. The control data DATA is, for example, a command and an operation timing data for operating the whole of the device 10. Further, the serial I/F 13 supplies the control data received externally to the serial command input/output unit 12.

The serial command input/output unit 12 supplies the control data received from the serial I/F 13 to VCOPLL 11, TG 16, ISP 14 and DOUT I/F 15.

The TG 16 gives instructions to the foregoing ST 17 and ISP 14 based on the control data DATA output from the serial command input/output unit 12 to control each operation of the sensor core unit 19 and the ISP 14. The TG 16 instructs an operation timing to the ISP 14 executing an image signal processing and the ST 17 controlling the operation timing of the sensor core unit 19. Specifically, the TG 16 gives instructions such as the following timings to the ST 17. One is a timing for reading a stored signal charge photo-electrically converted by the sensor core unit 19 as an image (video) signal. Another is a timing for digitizing the read image signal (A/D conversion). Another is a timing for transferring an image signal to the ISP 14. Further, the TG 16 supplies the following timings to the ISP 14. One is a timing of an image signal is transferred from the sensor core unit 19. The other is a timing for outputting an image signal to the DOUT I/F 15.

The ST 17 supplies a reset signal RESET and a read signal READ to the sensor core unit 19 in accordance with an operation timing output from the TG 16. The foregoing reset signal RESET and read signal READ are digital signals capable of taking either of level "L" or "H".

Further, the ST 17 instructs an operation timing for generating a ramp wave voltage RAMP and the number of generation times to the RAMPG 18.

The foregoing RAMPG 18 generates a ramp wave voltage RAMP based on an operation timing output from the ST 17, and then, supplies the voltage RAMP as a reference voltage to the ADC 31. Specifically, the RAMPG 18 generates a ramp wave voltage RAMP when reading a pixel reset voltage (hereinafter, referred to as reset voltage) and an image signal (pixel signal voltage) from the sensor core unit 19.

The pixel unit 30 has a plurality of pixels arrayed like a matrix. In the pixel unit 30, a reset operation and an image signal read operation are carried out with respect to a plurality of pixels based on reset signal RESET and read signal READ, which are output from the ST 17. A reset voltage and an image signal voltage are read from the pixel unit 30 according to the foregoing reset and read operations, and then, supplied to the ADC 31.

The ADC 31 digitizes the foregoing reset voltage and image signal voltage read from the pixel unit 30 using a ramp wave voltage RAMP output from the RAMPG 18 to generate digital signals (A/D conversion). Thereafter, the ADC 31 takes the difference between the foregoing two digital signals, and then, supplies the difference as an A/D conversion signal to the ISP 14.

The ISP 14 executes various image signal processings such as white balance processing, wide dynamic range processing, noise reduction processing and defect pixel correction processing with respect to the A/D conversion signal output from the ADC 31 based on a timing supplied from the TG 16. Then, the ISP 14 supplies a digital signal, which is subject to the foregoing various image signal processings, to the DOUT I/F 15. The DOUT I/F 15 outputs the digital signal outside the solid-state imaging device 10.

The lens unit 20 collects lights externally, and then, radiates them to the pixel unit 30 through a color separation filter. For example, the color separation filter separates lights every RGB.

<Detailed Configuration of Sensor Core Unit 19>

The detailed configuration of the sensor core unit 19 will be explained below with reference to FIG. 2. FIG. 2 is a circuit diagram showing the configuration of the sensor core unit 19. As described above, the sensor core unit 19 includes a pixel unit 30 and an ADC 31.

The pixel unit 30 is provided with a plurality of pixels 40 arrayed like a matrix. In this case, (n+1) pixels 40 area arrayed in the horizontal direction while (m+1) pixels 40 are arrayed in the vertical direction. These pixels 40 are connected in common to each of a plurality of vertical signal lines VLINi (i=1 to n+1) every (m+1) pixels arrayed in the vertical direction. One end of each vertical signal line VLINi is connected with a MOS transistor TL and a plurality of ADCs 31a forming the ADC 31.

Each pixel 40 includes MOS transistors Tb, Tc, Td and a photodiode PD. A gate electrode of the MOS transistor Tc is supplied with a reset signal RESETj (j=1 to m+1) output from the ST 17. A drain of the MOS Transistor Tc is supplied with a power supply voltage VDD (e.g., 2.8 V), and a source thereof is connected to a floating diffusion (hereinafter, referred to as FD) node N1. In other words, the MOS transistor Tc functions as a reset transistor, which sets the FD node N1 to a reset voltage given as a reference voltage of an image signal read from the photodiode PD. A gate electrode of the MOS transistor Tb is supplied with a read signal READj (j=1 to m+1) output from the ST 17. A drain of the MOS transistor Tb is connected to the FD node N1, and a source thereof is connected to a cathode of the photodiode PD. In other words, the MOS transistor Tb functions as a signal charge read transistor. In this case, an anode of the photodiode PD is grounded.

A gate electrode of the MOS transistor Td is connected to the FD node N1, and a drain thereof is supplied with a power supply voltage VDD, and further, a source thereof is connected to a vertical signal line VLINi. In other words, the MOS transistor Td functions as an amplification transistor, which amplifies a voltage of the FD node N1 and outputs the voltage to a vertical signal line VLINi.

In this case, signal lines for transmitting the foregoing reset signal RESETj and read signal READj are extended to the horizontal direction crossing the extended direction of the vertical signal line VLINi. Further, the signal line is connected in common to (n+1) pixels 40 horizontally arrayed.

A drain of each MOS transistor TL is connected to one end of the vertical signal line VLINi, and a gate electrode thereof is supplied with a constant bias voltage VLL, which is generated by a bias generator circuit 41. A source of the MOS transistor TL is grounded. Each MOS transistor TL and MOS transistor Td included in the pixel 40 form a source follower circuit.

The foregoing ADC 31 includes (n+1) ADCs 31a connected to the vertical signal lines VLINi and (n+1) register circuits 52 for transferring data. Each ADC 31a has an analog comparator circuit 50 and a binary counter 51 with a reset/enable/inversion function. An inverting input terminal of the comparator circuit 50 is supplied with a signal of the drain of the MOS transistor TL, that is, the vertical signal line VLINi. A non-inverting input terminal of the comparator circuit 50 is supplied with a ramp wave voltage RAMP output from the RAMPG 18. The comparator circuit 50 compares two signal voltages supplied to the foregoing inverting and non-inverting input terminals, and then, supplies a signal corresponding to the comparison result to the counter 51.

The counter 51 is supplied with the comparison result of the comparator circuit 50, a counter reset control signal RST output from the ST 17, a counter inversion control signal INV and a clock signal CLK. In this case, the clock signal CLK may be supplied from the ST 17, or may be directly supplied from the VCOPLL 11.

The counter 51 generates an output signal having a plurality of bits, and sets a signal supplied from the comparator circuit 50 as an enable signal EN, and further, counts a clock signal CLK in accordance with the foregoing enable signal EN. For example, when the enable signal EN is level "H", the counter 51 counts a clock signal CLK while when it is level "L", the counter 51 does not count it. Moreover, the counter 51 counts a clock signal CLK for a first period until a ramp wave voltage RAMP is lowered from the initial value to the potential of the vertical signal line VLINi. The count value of the counter 51 is initialized according to a counter reset control signal RST, and all bits of the counter value having a plurality of bits are inverted according to a counter inversion control signal INV. In the ADC 31, if k-bit (k=natural number) A/D conversion is executed, the counter 51 takes a count by $2^k$ at least. For example, if k=10, the counter 51 takes a count by 1024 at least.

The register circuit 52 is stored with a count value of the counter 51. A digital signal stored in the register circuit 52 is successively transferred to the ISP 14 according to the operation of the register circuit 52. The digital signal transferred from the register circuit 52 to the ISP 14 is an image signal obtained by horizontal-one-line (n+1) pixels 40 crossing the vertical signal line VLINi. Namely, the register circuit 52 collectively transfers image signals read from horizontal-one-line (n+1) pixels 40 to the ISP 14.

<Operation of ADC 31>

Figure 3:
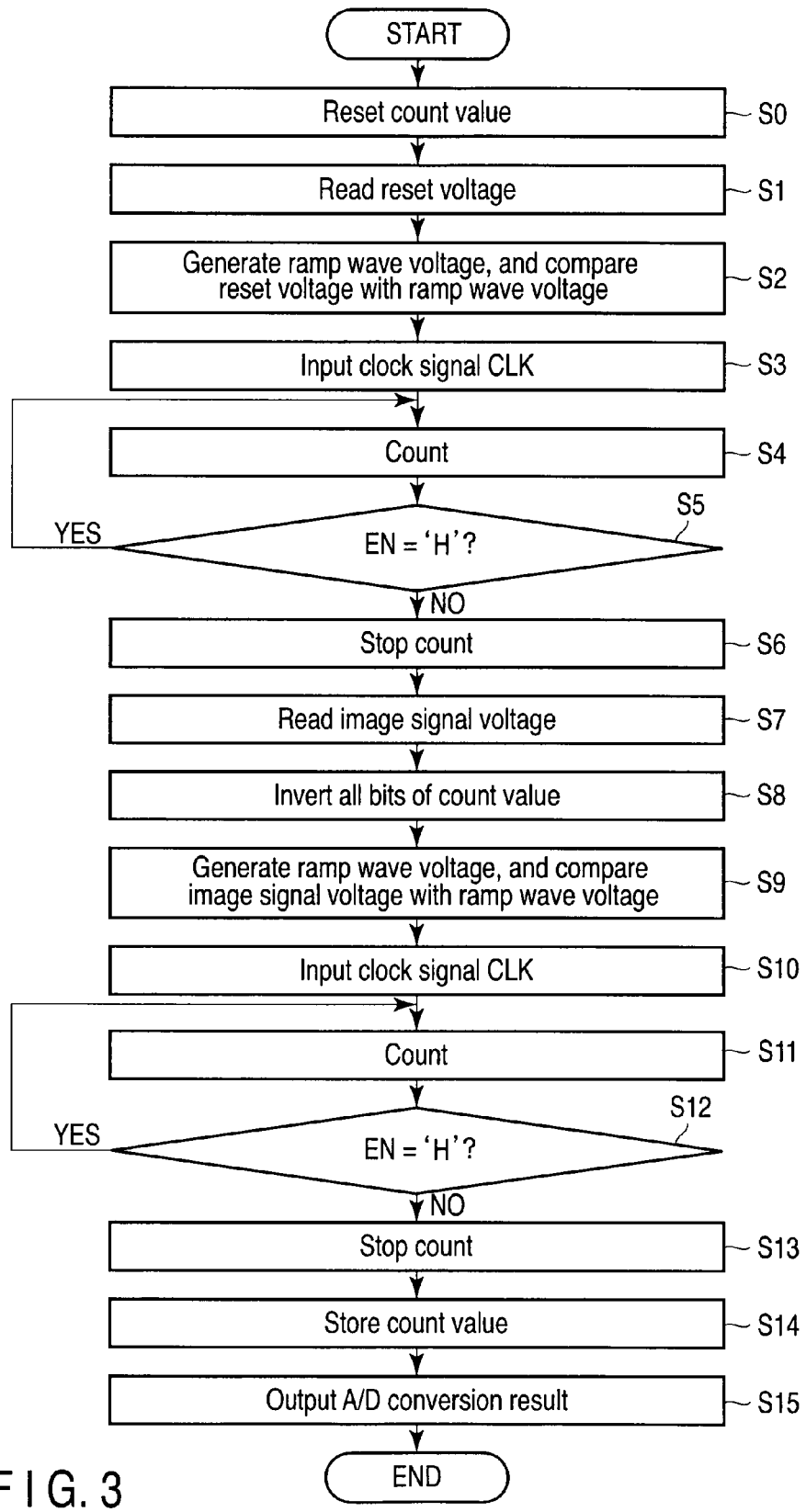
FIG. 3 is a flowchart to explain an operation of an ADC included in the solid-state imaging device shown in FIG. 1.

The operation when reset voltage and image signal voltage read from the pixel unit 30 are digitized by the ADC 31 (A/D conversion) will be explained below with reference to a flowchart of FIG. 3.

First, the ST 17 gives instructions to reset a count value to the counter 51. In this way, the counter 51 resets the count value to 0 (step S0). Thereafter, a reset voltage is read from the pixel unit 30. The reset voltage is supplied to the inverting input terminal of the comparator circuit 50 by way of the vertical signal line VLINi (step S1). Moreover, the RAMPG 18 generates a ramp wave voltage RAMP for reset voltage. The comparator circuit 50 compares the reset voltage with the ramp wave voltage RAMP for reset voltage (step S2). For example, a clock signal CLK is input to the counter 51 from the ST 17 (step S3). The counter 51 starts a count operation in accordance with an enable signal EN output from the comparator circuit 50 (step S4). Then, it is determined whether or not the enable signal EN output from the comparator circuit 50 is level "H" (step S5). If the enable signal EN is level "H" (YES), the process flow returns to step S4, and the counter 51 executes a count-up in synchronous with a clock signal CLK. Conversely, if the enable signal EN is level "L" (NO), the counter 51 stops a count of the clock signal CLK, and thus, A/D conversion ends (step S6).

Then, an image signal voltage is read from the pixel unit 40 (step S7). Thereafter, the counter 51 inverts all bits of a binary count value in each logic level (step S8). The RAMPG 18 generates an image signal ramp wave voltage RAMP. The comparator circuit 50 compares the image signal voltage with the image signal ramp wave voltage RAMP (step S9). For example, a clock signal CLK is input to the counter 51 from the ST 17 (step S10). The counter 51 starts a count operation in accordance with an enable signal EN output from the comparator circuit 50 (step S11). Then, it is determined whether or not the enable signal EN output from the comparator circuit 50 is level "H" (step S12). If the enable signal EN is level "H" (YES), the process flow returns to step S11, and the counter 51 executes a count-up in synchronous with a clock signal CLK. Conversely, if the enable signal EN is level "L" (NO), the counter 51 stops a count of the clock signal CLK, and thus, A/D conversion ends (step S13). Thereafter, the register circuit 52 stores a count value of the counter 51 (step S14), and then, outputs the A/D conversion result (count value) (step S15).

<First Operation Example of Solid-State Imaging Device>

The operation of a solid-state imaging device including the foregoing ADC 31 will be explained below with reference to FIG. 4. FIG. 4 is a waveform chart showing a state that analog reset voltage and image signal voltage supplied from the pixel unit 30 to the ADC 31 are digitized (A/D conversion). In FIG. 4, the following parameters are shown therein. One is a ramp wave voltage RAMP given as a reference voltage output from the RAMPG 18. Another is a reset voltage and an image signal voltage (i.e., A/D conversion input voltage in FIG. 4), which are output from the pixel unit 30. Another is a clock signal CLK output from the VCOPLL 11. Another is a digital value (i.e., A/D conversion output) given as a count value of the counter 51. This embodiment relates to the case where the difference between the foregoing reset voltage and image signal voltage output from the pixel unit 30 is converted into a four-bit digital value. The operation of the RAMPG 18 is controlled by the ST 17. The ramp wave voltage RAMP output from the RAMPG 18 changes from a value larger than the voltage amplitude range of reset voltage and image signal voltage to a value smaller than that. Specifically, the ramp wave voltage RAMP with respect to the reset voltage has a voltage amplitude from a [V] (first voltage) to −a [V] using a reset voltage as a reference. Moreover, the ramp wave voltage RAMP with respect to the image signal voltage has a voltage amplitude from a [V] (second voltage) to −b [V] using a reset voltage as a reference. The relation of |b|>|a| is established between a [V] and −b [V], and further, the foregoing first and second voltages may be different values.

In this case, the gradient of the ramp wave voltage RAMP output from the RAMPG 18 and the frequency of the clock signal CLK are always constant in A/D conversion of reset voltage and image signal voltage.

First, at the time t0, a reset voltage is read from the pixel unit 30, and further, a ramp wave voltage RAMP is output from the RAMPG 18. In the ADC 31, A/D conversion of the reset voltage is carried out. Specifically, the processes from steps S0 to S6 described in FIG. 3 are carried out. At the time t0, when the counter 51 receives a reset instruction from the ST 17, the count value of the counter 51 is reset to "4"b0000 (0)'. According to the foregoing count value, all bits of a four-bit binary signal are 0, and further, the count value means "0" of a decimal number. The initial value of the ramp wave voltage RAMP is a [V] larger than a reset voltage. The comparator circuit 50 compares the ramp wave voltage RAMP with the reset voltage. In this case, the ramp wave voltage RAMP is larger than the reset voltage; therefore, an output of the comparator is set to level "H". Consequently, the counter 51 is supplied with an "H" level enable signal EN. Input of a clock signal CLK to the counter 51 from the ST 17 is started at the same time with the start of the comparison operation by the comparator circuit 50. Therefore, the counter 51 starts a count-up operation in synchronous with the foregoing clock signal CLK. The ramp wave voltage RAMP starts decrement from the time t0 at a predetermined gradient. The counter 51 continues a count-up operation in synchronous with the clock signal CLK. Then, at the time t1, when the ramp wave voltage RAMP coincides with the reset voltage, the output of the comparator changes to level "L". Therefore, the counter 51 is supplied with an "L" level enable signal EN, and thereby, the counter 51 stops a count operation. For example, the count value of the counter 51 is a binary four-bit positive value "4"b0101 (+5), which is counted by +5 and has no sign. Then, at the time t2, when the amplitude of the ramp wave voltage RAMP output from the RAMPG 18 reaches the final value −a [V], according to the instruction from the ST 17, the ramp wave voltage RAMP output from the RAMPG 18 is returned from −a [V] to a [V]. Simultaneously, the supply of the clock signal CLK to the counter 51 is stopped. In this way, A/D conversion of the reset voltage is completed. The ramp wave voltage RAMP keeps a constant amplitude a [V] for a period from time t2 to time t5.

At the time t3, an image signal is read from the pixel 30 according to the instruction by the ST 17, and then, supplied to the comparator circuit 50. Thereafter, A/D conversion of an image signal voltage is carried out. Specifically, the processes from steps S7 to S13 are carried out.

After the image signal is read, at the time t4, the counter 51 inverts the signal logic level of all bits. Specifically, a four-bit count value "4"b0101 (+5) is converted into the complement of 2 binary negative value "4"b1010 (−6). This converted value is equivalent to a value of subtracting the count value '5' before inversion from the reset initial value "0" and further, subtracting "1".

At the time t5, the RAMPG 18 lowers the ramp wave voltage RAMP from a [V] at a constant gradient so that the comparator circuit 50 starts a comparison operation. Simultaneously, input of a clock signal CLK to the counter 51 from the ST 17 is started. The comparator circuit 50 compares a ramp wave voltage RAMP with an image signal voltage. The counter 51 counts a clock signal CLK if an enable signal EN is level "H". At the time t5, the image signal voltage is smaller than the ramp wave voltage RAMP; therefore, the counter 51 starts a count-up operation from the counter value "4"b1010 (−6) based on the clock signal CLK. Then, the ramp wave voltage RAMP lowers, and at the time t6, when the ramp wave voltage RAMP coincides with the image signal voltage, the output of the comparator circuit 50 changes to level "L".

Therefore, the counter 51 is supplied with an "L" level enable signal EN, and thereby, the counter 51 stops a count operation. For example, the count value of the counter 51 is a binary four-bit positive value "4"b1000 (+8), which is counted by +14 from "−6" and has no sign. Namely, according to the properties of the complement of 2, the final count value is a value, that is, 14−5−1=8, which subtracts "1" from the difference between A/D conversion result +14 with respect to the image signal voltage between the A/D conversion result +5 with respect to the reset voltage. Thereafter, at the time t7, when reaching the final value −b [V], the ramp wave voltage RAMP output from the RAMPG 18, is returned from −b [V] to a [V] according to the instruction from the ST17. Simultaneously, the supply of the clock signal CLK to the counter 51 is stopped. Thereafter, the count value of the counter 51 is stored in the register 42, and further, the content of the register circuit 52 is supplied to the ISP 14.

The foregoing operation is carried out, thereby, the A/D conversion result (i.e., counter output value) of the ADC 31 is equivalent to a value subtracting "1" from the difference between the A/D conversion result with respect to the image signal voltage and the A/D conversion result with respect to the reset voltage. In other words, the ADC 31 is capable of obtaining a digital signal in which the difference between the image signal voltage and the reset voltage is digitized (A/D conversion).

The digital signal obtained by the ADC 31 is equivalent to a value subtracting "1" of a decimal number from the difference between the A/D conversion result with respect to the image signal voltage and the A/D conversion result with respect to the reset voltage in the operation example case shown in FIG. 4. Thus, the digital signal (foregoing value) is short by "1" only from "9" to be inherently obtained. However, a +1 processing is carried out using the after-stage ISP 14, and thereby, there is no any problem.

<Second Operation Example of Solid-State Imaging Device>

According to the first operation example, the digital signal obtained by the ADC 31 becomes short by "1" only from "9" to be inherently obtained. For this reason, there is a need to make corrections using the after-stage circuit.

Figure 5:
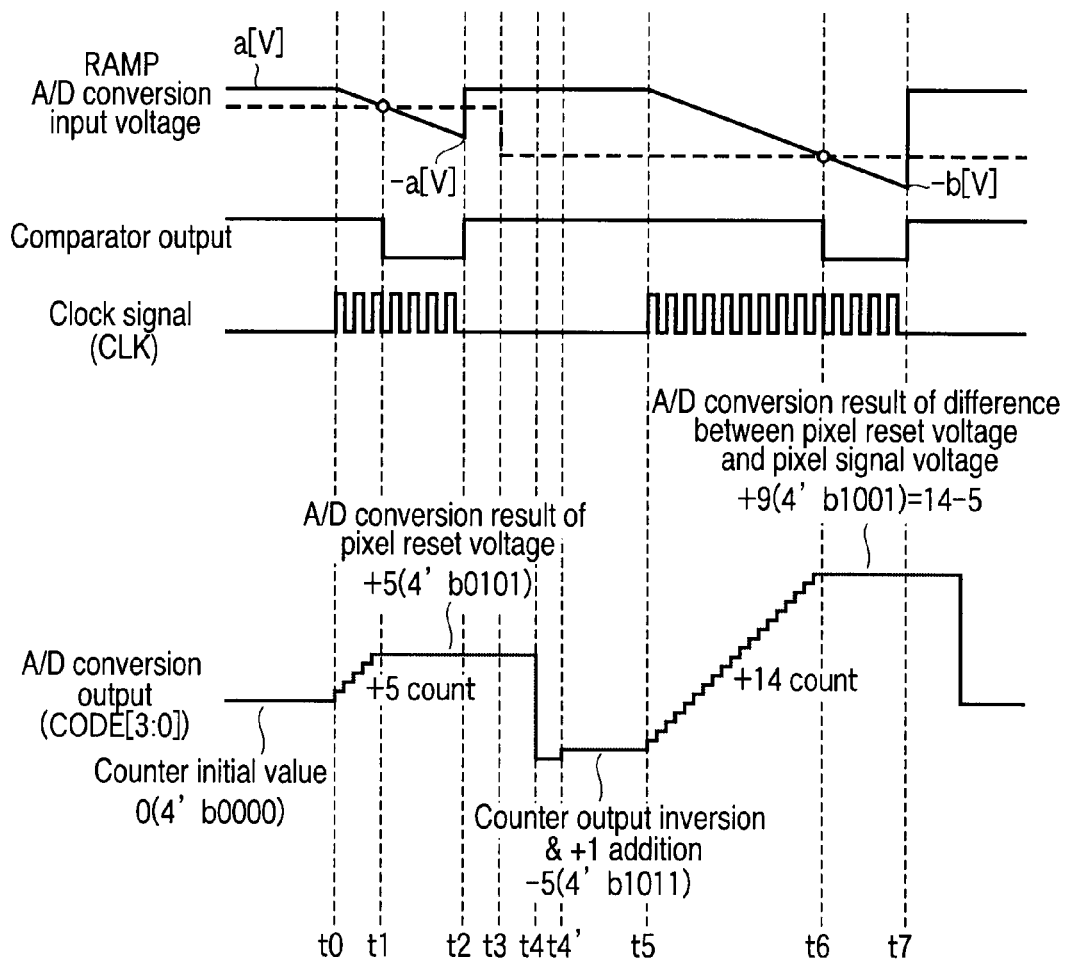
FIG. 5 is a waveform chart showing another example of the operation of the ADC shown in FIG. 2.

In place of carrying out a +1 correction processing using the after-stage circuit, the operation of the case of making corrections using the ADC 31 will be explained below with reference to FIG. 5. Specifically, according to the operation shown in FIG. 5, at the time t4, the signal logic level of all bits of the counter 51 is inverted, and thereafter, at the time t4', an operation for adding "1" to a count value is additionally carried out. The foregoing operation is carried out, and thereby, a four-bit count value "4"b1010 (−6) after all-bit signal of the counter 51 is inverted is corrected to the complement of 2 binary negative value "4"b1011 (−5).

Therefore, the final A/D conversion result (i.e., counter output value) is equivalent to a value "4"b1001 (+9) of the difference the A/D conversion result with respect to the image signal voltage and the A/D conversion result with respect to the reset voltage.

<Configuration of Binary Counter 51>

Figure 6:
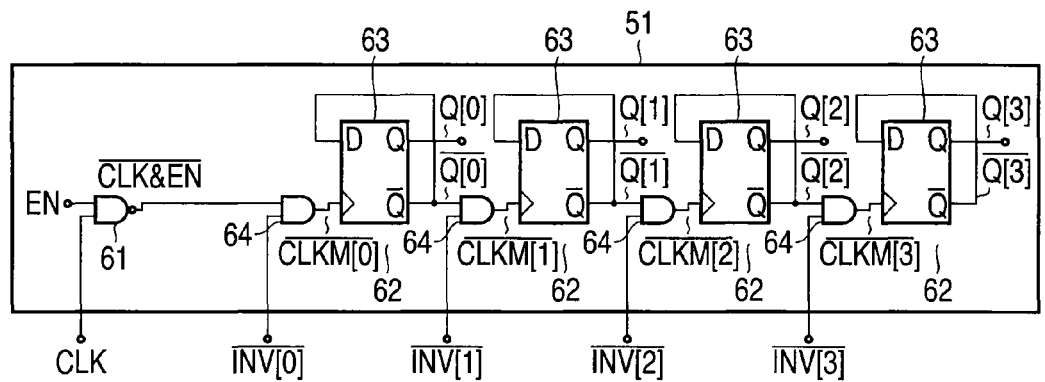
FIG. 6 is a circuit diagram showing the detailed configuration of a binary counter shown in FIG. 2.

The detailed configuration of the binary counter 51 shown in FIG. 2 will be explained below with reference to FIG. 6. FIG. 6 shows the configuration of a binary counter 51 of the case where an output signal Q is Q[0] to Q[3], that is, has four bits. The binary counter 51 includes a NAND gate circuit 61 supplied with a clock signal CLK and an enable signal EN, and multi-stage connected four one-bit counters 62. The NAND gate circuit 61 outputs an inverted clock signal /CLK when an enable signal EN is level "H".

Each one-bit counter 62 includes a D-type flip-flop circuit 63 and an AND gate circuit 64. The flip-flop circuit 63 has a data input terminal (D), a clock input terminal, a data output terminal (Q) and an inverted data output terminal (/Q). The foregoing inverted data output terminal (/Q) and data input terminal (D) are connected.

The AND gate circuit 64 of the one-bit counter 62 having the least significant bit, that is, output signal Q[0] bit is supplied with an output signal /(CLK & EN) of the NAND gate circuit 61 and a counter inversion control signal (hereinafter, referred to as inversion control signal) /INV[0]. The AND gate circuit 64 takes the logical product of the foregoing two signals, and then, supplies it to the clock input terminal of the corresponding flip-flop circuit 63. The AND gate circuit 64 of the one-bit counter 62 having output signal Q[1] bit is supplied with a signal of the inverted data output terminal (/Q) of the flip-flop circuit 63 having output signal Q[0] bit lower one bit than the output signal Q[1] bit and a inversion control signal /INV[1]. The AND gate circuit 64 takes the logical product of the foregoing two signals, and then, supplies it to the clock input terminal of the corresponding flip-flop circuit 63. AND gate circuits 64 other than above are supplied with a signal of the inverted data output terminal (/Q) of the flip-flop circuit 63 lower one bit than output signal Q bit of these gates and a inversion control signal /INV. These AND gate circuits 64 take the logical product of the foregoing two signals, and then, supply it to the clock input terminal of the corresponding flip-flop circuit 63.

In other words, the binary counter 51 of FIG. 6 has the following configuration in contrast to a general four-bit asynchronous binary counter, which performs a ½ frequency division of an input clock signal. Namely, according to the foregoing configuration, an AND gate circuit is interposed between an inverted data output terminal of each flip-flop circuit and a clock input terminal of the next-stage flip-flop circuit. Further, another input terminal of the AND gate circuit of each bit is supplied with an inversion control signal /INV[3:0].

Figure 7:
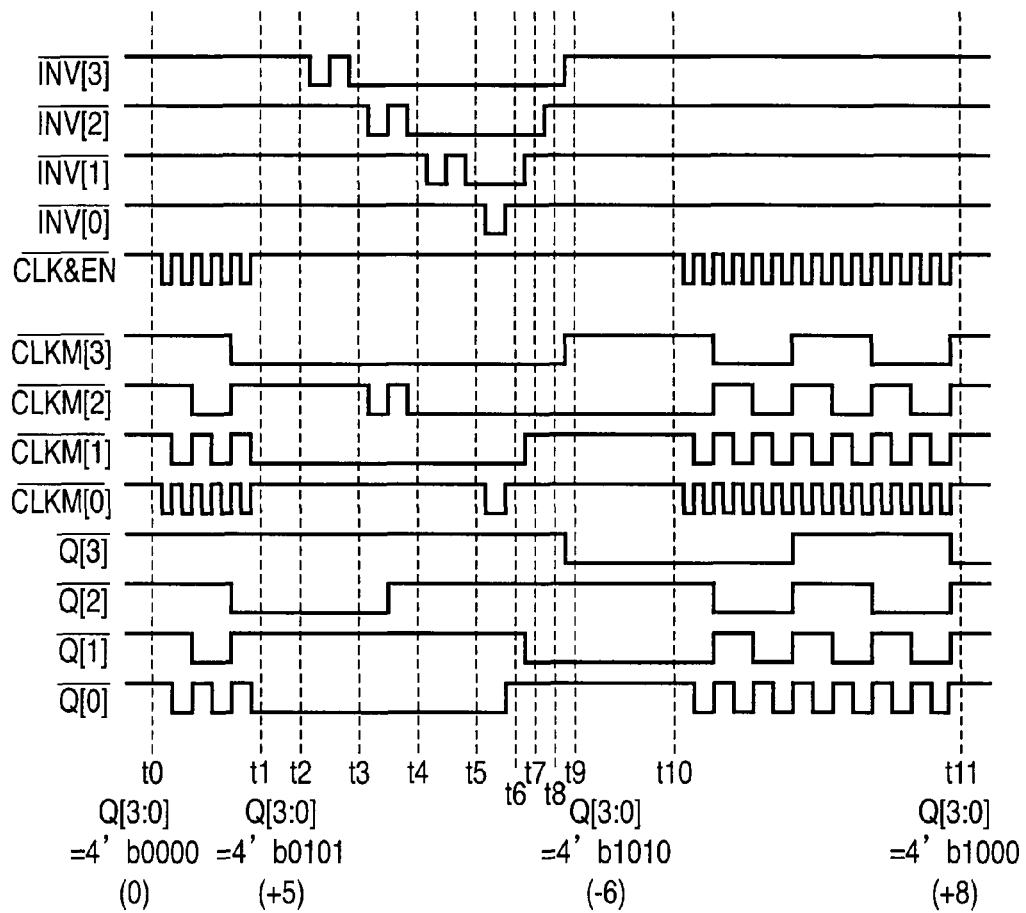
FIG. 7 is a timing chart to explain one example of an operation of the binary counter shown in FIG. 6.

FIG. 7 is a timing chart showing one example of the operation of the binary counter 51 shown in FIG. 6. Hereinafter, an operation of inverting all bit signals will be mainly explained in particular.

First, at the time t0, a counter is in a reset initial state, that is, "4"b0000 (0). Further, an inversion control signal /INV[3:0] is all set to logic "H". The counter is counted up by five counts for a period from time t0 to time t1; therefore, the count value is "4"b0101 (+5). For a period from time t2 to t5, the most significant bit inversion control signal /INV[3], lower bit inversion signals /INV[2] and /INV[1] successively change to logic "L", logic "H" and Logic "L", respectively. In this case, only when a signal of the inverted data output terminal /Q of the lower-bit flip-flop circuit 63 is logic "H", a signal /Q of the inverted data output terminal of the upper-bit flip-flop circuit 63 is inverted after the inversion control signal /INV changes from logic "L" to logic "H". According to this example, /Q[2] is inverted from logic "L" to "H" for a period from time t3 to t4. Thereafter, for a period from time t5 to time t6, the least significant bit inversion control signal /INV[0] changes from logic "L" to logic "H". In this way, a signal of the inverted data output terminal /Q[0] of the least significant bit flip-flop circuit 63 is inverted. According to this example, a signal of the inverted data output terminal /Q[0] is inverted from logic "L" to "H". For a period from time t6 to time t9, the inversion control signal /INV[1], which is the second bit from the least significant bit, the inversion control signal /INV[2], which is the third bit from the least significant bit, and the most significant bit inversion control signal /INV[3] successively changes to logic "H". In this case, only when a signal of the inverted data output terminal /Q of the least significant bit flip-flop circuit 63 is logic "H", the signal of the inverted data output terminal /Q is inverted after the inversion control signal /INV changes from logic "L" to logic "H". According to this example, for a period from time t6 to time t7 and a period from time t8 to time t9, a signal of the terminal /Q[1] and a signal of the terminal /Q[3] are respectively inverted from logic "H" to logic "L". The foregoing operation is carried out, and thereby, an inversion operation of all bits is realizable.

Namely, the binary counter 51 shown in FIG. 6, which performs the operation shown in FIG. 7, has the following configuration. The binary counter 51 has a plurality of multi-stage connected one-bit counters 62. Each one-bit counter 62 has a flip-flop circuit 63 and an AND gate circuit 64. Specifically, the flip-flop circuit 63 has a data input terminal, a clock input terminal, a data output terminal and an inverted data output terminal, and is configured so that the inverted data output terminal and the data input terminal are connected. The AND gate circuit 64 is supplied with a clock signal and an inversion control signal in the least significant bit. Further, the AND gate circuit 64 is supplied with a signal of the inverted data output terminal of the least significant bit flip-flop circuit and an inversion control signal in bits other than the least significant bit. Furthermore, the AND gate circuit 64 takes the logical product of the foregoing two signals, and then, supplies it to the clock input terminal of the corresponding flip-flop circuit. For a period when the comparator circuit compares a reset voltage with a ramp wave voltage RAMP, an inversion control signal input to the AND gate circuit 64 of each one-bit counter is set to logic "H". An inversion control signal input to the AND gate circuit 64 of the most significant bit one-bit counter 62 changes in the order of logic "L", logic "H" and logic "L", before the comparison of an image signal voltage with a ramp wave voltage RAMP is started and after the foregoing comparison of the reset voltage with the ramp wave voltage RAMP ends. Next, an inversion control signal input to the AND gate circuit 64 of the one-bit counter 62, which is lower one bit than the most significant bit, changes in the order of logic "L", logic "H" and logic "L". Next, an inversion control signal input to the AND gate circuit 64 of the one-bit counter 62, which is lower two bit than the most significant bit, changes in the order of logic "L", logic "H" and logic "L". Thereafter, an inversion control signal input to the AND gate circuit 64 of the one-bit counter 62 of the least significant bit changes in the order of logic "L", logic "H" and logic "L". Thereafter, an inversion control signal input to the AND gate circuit 64 of the one-bit counter 62, which is upper one bit than the least significant bit, changes logic "H". Thereafter, an inversion control signal input to the AND gate circuit 64 of the one-bit counter 62, which is upper tow bit than the least significant bit, changes logic "H". Thereafter, an inversion control signal input to the AND gate circuit 64 of the one-bit counter 62 of the most significant bit changes logic "H". In this way, output data of the flip-flop circuit 63 of each one-bit counter is inverted after the comparator circuit 50 ends the comparison of the reset voltage with the ramp wave voltage RAMP.

Figure 8:
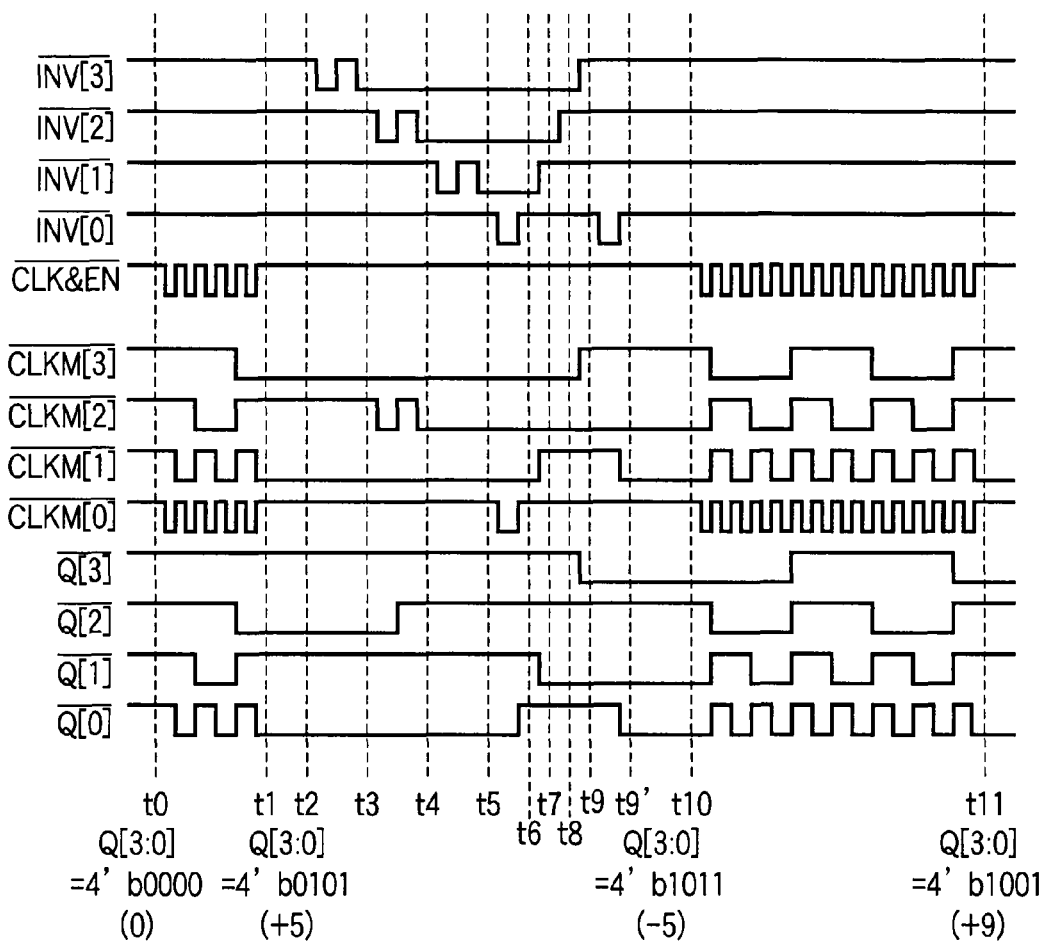
FIG. 8 is a timing chart to explain another example of an operation of the binary counter shown in FIG. 6.

FIG. 8 is a timing chart to explain a state that a +1 operation is further added after signals of all bits are inverted. This timing chart corresponds to the operation of the case of carrying out the +1 correction operation described in FIG. 5.

FIG. 8 differs from the foregoing FIG. 7 in that the least significant bit inversion control signal /INV[0] changes in the order of logic "L" and logic "H" for a period from time t9 to time t9' after all bits are inverted. According to an operation from time t9 to time t9', the least significant bit flip-flop circuit 63 is advanced by one clock, and in this way, a +1 operation is realizable.

Namely, the binary counter 51 shown in FIG. 6, which performs the operation shown in FIG. 8, has the following configuration. The binary counter 51 has a plurality of multi-stage connected one-bit counters 62 corresponding to the foregoing number of bits. Each one-bit counter 62 has a flip-flop circuit 63 and an AND gate circuit 64. Specifically, the flip-flop circuit 63 has a data input terminal, a clock input terminal, a data output terminal and an inverted data output terminal, and is configured so that the inverted data output terminal and the data input terminal are connected. The AND gate circuit 64 is supplied with a clock signal and an inversion control signal in the least significant bit. Further, the AND gate circuit 64 is supplied with a signal of the inverted data output terminal of the least significant bit flip-flop circuit and an inversion control signal in bits other than the least significant bit. Furthermore, the AND gate circuit 64 takes the logical product of the foregoing two signals, and then, supplies it to the clock input terminal of the corresponding flip-flop circuit. For a period when the comparator circuit 50 compares a reset voltage with a ramp wave voltage RAMP, an inversion control signal input to the AND gate circuit of each one-bit counter is set to logic "H". An inversion control signal input to the AND gate circuit 64 of the least significant bit one-bit counter 62 changes in the order of logic "L", logic "H" and logic "L" before the comparison of an image signal voltage with a ramp wave voltage RAMP is started after the foregoing comparison of the reset voltage with the ramp wave voltage RAMP ends. Thereafter, data is transferred to one-bit counter, which is upper one bit than the least significant bit, and then, an input inversion control signal successively changes to logic "L", logic "H" and logic "L" in the order from the AND gate of the upper bit one-bit counter. Thereafter, an inversion control signal input to the AND gate 64 of the least significant bit one-bit counter changes in the order of logic "L" and logic "H". Thereafter, an inversion control signal input to the AND gate 64 of one-bit counter, which is upper one bit than the least significant bit, changes to logic "H". Thus, data is transferred to the least significant bit one-bit counter, and then, an input inversion control signal changes to logic "H" successively from the AND gate 64 of the lower bit one bit counter. Thereafter, an inversion control signal input to the AND gate 64 of the least significant bit one-bit counter changes in the order of logic "L" and logic "H". In this way, signals of all bits are inverted after the comparator circuit 50 ends the comparison of the reset voltage with the ramp wave voltage RAMP, and thus, "1" is added to a count value after all bits are inverted.

In the foregoing ADC of this embodiment and a solid-state imaging device including the ADC, the binary counter 51 with an inversion function has the following advantage. Specifically, a general asynchronous counter is configured in such a manner that a flip-flop circuit in which an inverted data output terminal and a data input terminal are connected is connected in multi-stage. In comparison with the general asynchronous counter, the binary counter 51 is configured by only adding an AND gate circuit between an inverted data output terminal of a flip-flop circuit and a clock input terminal of the next-stage flip-flop circuit. Moreover, a pulse signal (inversion control signal) is forcedly applied to one input terminal of each AND gate circuit over the range from the upper bit to the lower bit. In this way, an inversion operation of all bits of the binary counter is realized, or it is possible to add "1" to a count value after all bits are inverted, in addition to the inversion operation of all bits. In other words, the inversion function of the binary counter is realized by adding elements reduced to the minimum; therefore, this serves to reduce the area of an ADC included in a solid-state imaging device.

Second Embodiment

FIG. 9 is a circuit diagram showing detailed configuration of a binary counter 51 used for an ADC and a solid-state imaging device according to a second embodiment. The binary counter 51 shown in FIG. 9 is used in the ADC 31 of FIG. 2 in place of the binary counter of FIG. 6. As well as the binary counter of FIG. 6, the binary counter 51 has the configuration of the case where the output signal is Q[0] to Q[3], that is, four bits. The foregoing binary counter 51 has four multi-stage connected one-bit counters 62. A one-bit counter of the least significant bit, that is, output signal Q[0] bit differs from one-bit counters of bits other than output signal Q[0] bit in its configuration.

The one-bit counter 62 of output signal Q[0] bit has an AND gate circuit 71, an inverter circuit 72, a buffer circuit 73, a selector gate circuit 74, a latch circuit 75 and a register circuit 76. Specifically, the AND gate circuit 71 is supplied with an inverted clock signal /CLK and an inversion control signal /INV[0]. The foregoing inverter circuit 72 and buffer circuit 73 are supplied with an output signal of the AND gate circuit 71. The selector gate circuit 74 is supplied with output signals from the foregoing inverter circuit 72 and buffer circuit 73, and selects and outputs either of the foregoing output signals based on a select signal QL[0] input to a select signal input terminal (S). The latch circuit 75 latches an output signal of the selector gate circuit 74 based on an enable signal EN. The register circuit 76 stores an output signal of the latch circuit 75 based on a storage control signal RD, and supplies the output signal as a select signal QL[0] to the selector gate circuit 74. In this case, the latch circuit 75 always outputs the output signal of the selector gate circuit 74 from a data output terminal (Q) and an inverted data output terminal (/Q) when an enable signal EN is logic "H". Further, the latch circuit 75 latches the output signal of the selector gate circuit 74 at the fall edge when the enable signal EN changes from logic "H" to logic "L".

Other one-bit counters except the least significant bit each has the same configuration as the one-bit counter shown in FIG. 6. Namely, these one-bit counters each includes a flip-flop circuit 63 and an AND gate circuit 64.

In the binary counter 51 shown in FIG. 9, the one-bit counter 62 of the least significant bit sets an inverted clock signal /CLK as the first-bit count value Q[0] for a period when an enable signal EN is logic "H". Moreover, the one-bit counter 62 latches the value of the inverted clock signal /CLK at the fall edge when the enable signal EN changes from logic "H" to logic "L". In this way, the foregoing counter 62 functions as a one-bit counter. In addition, the foregoing counter 62 stores a value of the first-bit count value Q[0] in the register circuit 76 in order to hold a counter value after the foregoing operation. In accordance with the result, the counter 62 controls the selection operation of the selector circuit 74, which outputs either of an inverted clock signal /CLK and a normal clock signal CLK, as an input signal of the latch circuit 75.

FIG. 10 is a timing chart to explain one example of the operation of the binary counter 51 shown in FIG. 9. Hereinafter, an operation of carrying out a +1 correction processing after inverting signals of all bits will be mainly explain in particular.

First, at the time t0, the counter 51 is in a reset state, that is, "4"b0000 (0), and an inversion control signal /INV[3:0] is all set to logic "H". For a period from time t0 to time t1, the counter 51 is counted up by five counts until an enable signal EN changes from logic "H" to logic "L", and thus, the count value is set to "4"b0000 (+5). For a period from time t1 to time t2, a storage control signal RD changes to logic "H" and logic "L" successively. In this case, the value of an output signal Q[0] of the latch circuit 75 of the first-bit one-bit counter is stored in the register circuit 76. In accordance with the logic level of the output signal of the register circuit 76, that is, a section signal QL[0], the selector circuit 74 selects either of a normal signal or an inverted signal of a signal taking the logical product of an inverted clock signal /CLK and an inversion control signal /INV as an input signal of the latch circuit 75. According to this example, for a period from time t1 to time t2, the output signal Q[0] of the latch circuit 75 is logic "H"; therefore, the latch circuit 75 is supplied with an inverted signal inverted by the inverter circuit 72. Thereafter, the enable signal EN is set to logic "H". Then, for a period fro time t2 to time t5, the inversion control signal /INV[3] of the most significant bit, inversion control signals /INV[2] and /INV[1] of lower bits successively changes to logic "L", logic "H" and logic "L", respectively. In this case, only when a signal of the inverted data output terminal /Q of the lower bit flip-flop circuit 75 or the lower bit flip-flop circuit 63 is logic "H", a signal of the inverted data output terminal /Q of the upper bit flip-flop circuit 63 is inverted after an inversion control signal /INV changes from logic "L" to logic "H". According to this example, for a period from time t3 to time t4, an output signal /Q[2] is inverted from logic "L" to logic "H". Thereafter, for a period from time t5 to time t6, the least significant bit inversion control signal /INV[0] changes to logic "L". In this way, a signal /Q[0] of the inverted data output terminal /Q of the least significant bit flip-flop circuit 75 is inverted. According to this example, the signal /Q[0] is inverted from logic "L" to logic "H". For a period from time 6 to time t9, the inversion control signal /INV[1], which is the second bit from the least significant bit, upper bit inversion control signals /INV[2] and /INV[3] successively changes to logic "H". In this case, only when a signal of the inverted data output terminal /Q of the lower bit flip-flop circuit 63 is logic "H", a signal of the inverted data output terminal /Q of the upper bit flip-flop circuit 63 is inverted after an inversion control signal /INV changes from logic "L" to logic "H". According to this example, for a period from time t6 to time t7 and for a period from time t8 to time t9, a signal /Q[1] and a signal /Q[3] are inverted from logic "H" to logic "L", respectively. Thereafter, for a period from time t9 to time t9', the inversion control signal /INV[0] changes to logic "H", and thereby, a +1 operation is realizable after an inversion operation of all bits is completed. According to this example, the signal /Q[0] is inverted from logic "H" to logic "L".

The foregoing operation is carried out, and thereby, it is possible to realize a +1 operation after an inversion operation of all bits is completed.

According to this second embodiment, the binary counter with an inversion function uses the clock input signal itself as a count value of the least significant bit compared with the binary counter described in the first embodiment. Therefore, a count operation is carried out at both edges of the clock input signal CLK. This serves to perform a high-speed count operation. As described in the first embodiment, the inversion function of the binary counter is realized by adding elements reduced to the minimum; therefore, this serves to reduce the area of an ADC included in a solid-state imaging device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An analog-to-digital converter circuit, comprising:
   a comparator configured to compare a first analog signal voltage with a first reference voltage, which changes at a constant gradient from a first voltage larger than the first analog signal voltage to a voltage smaller than the first analog signal voltage, and to compare a second analog signal voltage with a second reference voltage, which changes at a constant gradient from a second voltage larger than the second analog signal voltage to a voltage smaller than the second analog signal voltage;
   a binary counter configured to receive an output signal of the comparator and a clock signal, and to count the clock signal based on an output signal of the comparator to generate a count output having a plurality of bits, and to count the clock signal for a first period until the first reference voltage becomes equal to the first analog signal after the comparator starts to compare the first reference voltage with the first analog signal voltage, and to invert a logic level of the count output having a plurality of bits after the first period elapses, and to count the clock signal for a second period until the second reference voltage becomes equal to the second analog signal after the comparator starts to compare the second reference voltage with the second analog signal voltage, and further, to output the count output having a plurality of bits after the second period elapses as a conversion result of a potential difference between the first and second analog signal voltages; and
   a control circuit configured to carry out a control for inverting the logic level of the count output of the binary counter;
   wherein the binary counter includes:
   a first logical product gate circuit configured to output the clock signal based on an output signal of the comparator; and
   a plurality of multi-stage connected one-bit counters corresponding to the number of bits of the count output;
   each of the one-bit counters including:
   a flip-flop circuit including a data input terminal, a clock input terminal, a data output terminal, and an inverted data output terminal, the inverted data output terminal and the data input terminal being connected; and
   a second logical product gate circuit configured to supply with the clock signal output from the first logical product gate circuit an inversion control signal in a least significant bit, and to supply with a signal of the inverted data output terminal of the flip-flop circuit of a lower bit an inversion control signal in each bit except the least significant bit, and to take the logical product of the two signals, and to supply the logical product to the clock input terminal of a corresponding one of the flip-flop circuits.

2. The circuit according to claim 1, wherein the flip-flop circuit is a D-type flip-flip circuit.

3. The circuit according to claim 1, wherein the control circuit is configured:
   set the inversion control signal input to the second logical product gate circuit of the one-bit counter to logic "H"

for a period when the comparator compares the first analog signal voltage with the first reference voltage;

change the inversion control signal input to the second logical product gate circuit of the one-bit counter of the most significant bit in the order of logic "L", logic "H" and logic "L" before a comparison of the second analog signal voltage with the second reference voltage is started after the comparison of the first analog signal voltage with the first reference voltage ends, and change the inversion control signal input to the second logical product gate circuit of the one-bit counter in the order of logic "L", logic "H" and logic "L" from upper bits over one-bit counters from the most significant bit to bits upper one bit than the least significant bit;

change the inversion control signal input to the second logical product gate circuit of the one-bit counter of the least significant bit in the order of logic "L" and logic "H"; and change the inversion control signal input to the second logical product gate circuit of the one-bit counter, which is an upper one bit than the least significant bit, to logic "H", and change the inversion control signal input to the second logical product gate circuit of a lower-bit one-bit counter to logic "H" over one-bit counter, which is upper two bits than the least significant bit to a one-bit counter of the most significant bit, and further, invert a logic level of an output data of a flip-flop circuit of the one-bit counter after the comparison of the first analog signal voltage with the first reference voltage ends.

4. The circuit according to claim 1, wherein the control circuit is further configured to add "1" of a decimal number to a count value after all bits of the logic level of the count output having a plurality of bits are inverted.

5. The circuit according to claim 4, wherein the control circuit configured to:

set the inversion control signal input to the second logical product gate circuit of the one-bit counter to logic "H" for a period when the comparator compares the first analog signal voltage with the first reference voltage;

change the inversion control signal input to the second logical product gate circuit of the one-bit counter of the most significant bit in the order of logic "L", logic "H" and logic "L" before a comparison of the second analog signal voltage with the second reference voltage is started after the comparison of the first analog signal voltage with the first reference voltage ends, and change the inversion control signal input to the second logical product gate circuit of the one-bit counter in the order of logic "L", logic "H" and logic "L" from upper bits over one-bit counters from the most significant bit to bits upper one bit than the least significant bit;

change the inversion control signal input to the second logical product gate circuit of the one-bit counter of the least significant bit in the order of logic "L" and logic "H";

change the inversion control signal input to the second logical product gate circuit of the one-bit counter, which is an upper one bit than the least significant bit, to logic "H", and change the inversion control signal input to the second logical product gate circuit of a lower-bit one-bit counter to logic "H" over one-bit counter, which is upper two bits than the least significant bit to a one-bit counter of the most significant bit; and change the inversion control signal input to the second logical product gate circuit of the one-bit counter of the least significant bit in the order of logic "L" and logic "H", and invert a logic level of an output data of a flip-flop circuit of the one-bit counter after the comparison of the first analog signal voltage with the first reference voltage ends, and further, adding "1" of a decimal number to a count value after all bits are inverted.

6. The circuit according to claim 4, wherein the binary counter has a plurality of multi-stage connected one-bit counters corresponding to the number of bits of the count output, the one-bit counter of the least significant bit in the one-bit counters including:

a first logical product gate circuit configured to take the logical product of the clock signal and an inverted control signal;

a selector gate circuit configured to supply with a normal signal and an inverted signal of an output of the first logical product gate circuit, and to select and output either of the signals based on a selection signal;

a latch circuit configured to latch an output signal of the selector gate circuit based on an output signal of the comparator; and a register circuit configured to supply an output signal of the latch circuit, and to supply an output signal to the selector gate circuit as the selection signal, one-bit counters, which are upper bit than the least significant bit in the one-bit counters including:

a flip-flop circuit having a data input terminal, a clock input terminal, a data output terminal and an inverted data output terminal, the inverted data output terminal and the data input terminal being connected; and a second logical product gate circuit configured to supply with an inverted output signal of the latch circuit of the one-bit counter of the least significant bit an inverted control signal in a bit an upper one bit than the least significant bit, and to supply with a signal of the inverted data output terminal of the flip-flop circuit of a lower bit in a bit upper two bits than the least significant bit, and to take the logical product of the two input signals and to supply the logical product to the clock input terminal of the corresponding flip-flop circuit.

7. The circuit according to claim 6, wherein the control circuit configured to:

set each inversion control signal input to the first and second logical product gate circuits of the one-bit counter to logic "H" for a period when the comparator compares the first analog signal voltage with the first reference voltage;

change the inversion control signal input to the second logical product gate circuit of the one-bit counter of the most significant bit in the order of logic "L", logic "H" and logic "L" before a comparison of the second analog signal voltage with the second reference voltage is started after the comparison of the first analog signal voltage with the first reference voltage ends, and change the inversion control signal input to the second logical product gate circuit of the one-bit counter in the order of logic "L", logic "H" and logic "L" from upper bits over one-bit counters from the most significant bit to bits upper one bit than the least significant bit;

change the inversion control signal input to the first logical product gate circuit of the one-bit counter of the least significant bit, to logic "L";

change the inversion control signal input to the second logical product gate circuit of the one-bit counter, which is an upper one bit than the least significant bit, to logic "H", and change the inversion control signal input to the second logical product gate circuit of a lower-bit one-bit counter to logic "H" over one-bit counter, which is upper two bits than the least significant bit to a one-bit counter of the most significant bit; and change the inversion control signal input to the first logical product gate circuit of the one-bit counter of the least significant bit, to logic "H", and invert a logic level of an output data of a flip-flop circuit of the one-bit counter after the comparison of the first analog signal voltage with the first reference voltage ends, and further, adding "1" of a decimal number to a count value after all bits are inverted.

8. An analog-to-digital conversion method, comprising:

comparing a first analog signal voltage with a first reference voltage, which changes at a constant gradient from a first voltage larger than the first analog signal voltage to a voltage smaller than the first analog signal voltage using a comparator;

counting a clock signal by a binary counter to generate a count output having a plurality of bits for a first period until the first reference voltage becomes equal to the first analog signal voltage after a comparison of the first analog signal voltage with the first reference voltage is started;

inverting a logic level of each count output of the binary counter after the first period elapses;

comparing a second analog signal voltage with a second reference voltage, which changes at a constant gradient from a second voltage larger than the second analog signal voltage to a voltage smaller than the second analog signal voltage using the comparator;

counting a clock signal by the binary counter to generate a count output having a plurality of bits for a second period until the second reference voltage becomes equal to the second analog signal voltage after a comparison of the second analog signal voltage with the second reference voltage is started, and outputting each count output of the binary counter after the second period elapses as a conversion result of the potential difference between the first and second analog signal voltages; and adding "1" of a decimal number to the output count of the binary counter after inverting a logic level of each count output having a plurality of bits of the binary counter after the first period elapses.

9. A solid-state imaging device comprising:

an analog-to-digital converter circuit, the analog-to-digital converter circuit including: a comparator configured to compare a first analog signal voltage with a first reference voltage, which changes at a constant gradient from a first voltage larger than the first analog signal voltage to a voltage smaller than the first analog signal voltage, and to compare a second analog signal voltage with a second reference voltage, which changes at a constant gradient from a second voltage larger than the second analog signal voltage to a voltage smaller than the second analog signal voltage; and a binary counter configured to receive an output signal of the comparator and a clock signal, and to count the clock signal based on an output signal of the comparator to generate a count output having a plurality of bits, the binary counter configured to count the clock signal for a first period until the first reference voltage becomes equal to the first analog signal after the comparator starts to compare the first reference voltage with the first analog signal voltage to invert a logic level of the count output having a plurality of bits after the first period elapses, and to count the clock signal for a second period until the second reference voltage becomes equal to the second analog signal voltage after the comparator starts to compare the second reference voltage with the second analog signal voltage, and to output the count output having a plurality of bits after the second period elapses as a conversion result of the potential difference between the first and second analog signal voltages;

a pixel unit configured to generate a reset voltage as the first analog signal voltage, and to generate an image signal as the second analog signal voltage;

a reference voltage generator circuit configured to generate the first and second reference voltages; and a control circuit configured to execute a control for inverting a logic level of the count output having a plurality of bits of the binary counter, and to generate the first reference voltage by the reference voltage generator circuit for a period when the pixel unit generates the reset voltage, and to generate the second reference voltage by the reference voltage generator circuit for a period when the pixel unit generates the image signal:

wherein the binary counter includes:

a first logical product gate circuit configured to output the clock signal based on an output signal of the comparator; and a plurality of multi-stage connected one-bit counters corresponding to the number of bits of the count output;

each of the one-bit counters including:

a flip-flop circuit including a data input terminal, a clock input terminal, a data output terminal, and an inverted data output terminal, the inverted data output terminal and the data input terminal being connected; and a second logical product gate circuit configured to supply with the clock signal output from the first logical product gate circuit an inversion control signal in a least significant bit, and to supply with a signal of the inverted data output terminal of the flip-flop circuit of a lower bit an inversion control signal in each bit except the least significant bit, and to take the logical product of the two signals, and further, to supply the logical product to the clock input terminal of the corresponding flip-flop circuit.

10. The device according to claim 9, wherein the control circuit configured to:

set the inversion control signal input to the second logical product gate circuit of the one-bit counter to logic "H" for a period when the comparator compares the first analog signal voltage with the first reference voltage;

change the inversion control signal input to the second logical product gate circuit of the one-bit counter of the most significant bit in the order of logic "L", logic "H" and logic "L" before a comparison of the second analog signal voltage with the second reference voltage is started after the comparison of the first analog signal voltage with the first reference voltage ends, and change the inversion control signal input to the second logical product gate circuit of the one-bit counter in the order of logic "L", logic "H" and logic "L" from upper bits over one-bit counters from the most significant bit to bits upper one bit than the least significant bit;

change the inversion control signal input to the second logical product gate circuit of the one-bit counter of the least significant bit in the order of logic "L" and logic "H"; and change the inversion control signal input to the second logical product gate circuit of the one-bit counter, which is an upper one bit than the least significant bit, to logic "H", and change the inversion control signal input to the second logical product gate circuit of a lower-bit one-bit counter to logic "H" over one-bit counter, which is upper two bits than the least significant bit to a one-bit counter of the most significant bit, and further, invert a logic level of an output data of a flip-flop circuit of the one-bit counter after the comparison of the first analog signal voltage with the first reference voltage ends.

11. The device according to claim 9, wherein the control circuit configured to add "1" of a decimal number to a count value after all bits of the logic level of the count output having a plurality of bits are inverted.

12. The device according to claim 11, wherein the control circuit configured to:
set the inversion control signal input to the second logical product gate circuit of the one-bit counter to logic "H" for a period when the comparator compares the first analog signal voltage with the first reference voltage;
change the inversion control signal input to the second logical product gate circuit of the one-bit counter of the most significant bit in the order of logic "L", logic "H" and logic "L" before a comparison of the second analog signal voltage with the second reference voltage is started after the comparison of the first analog signal voltage with the first reference voltage ends, and change the inversion control signal input to the second logical product gate circuit of the one-bit counter in the order of logic "L", logic "H" and logic "L" from upper bits over one-bit counters from the most significant bit to bits upper one bit than the least significant bit;
change the inversion control signal input to the second logical product gate circuit of the one-bit counter of the least significant bit in the order of logic "L" and logic "H";
change the inversion control signal input to the second logical product gate circuit of the one-bit counter, which is an upper one bit than the least significant bit to logic "H", and change the inversion control signal input to the second logical product gate circuit of a lower-bit one-bit counter to logic "H" over one-bit counter, which is upper two bits than the least significant bit to a one-bit counter of the most significant bit; and
change the inversion control signal input to the second logical product gate circuit of the one-bit counter of the least significant bit in the order of logic "L" and logic "H", and invert a logic level of an output data of a flip-flop circuit of the one-bit counter after the comparison of the first analog signal voltage with the first reference voltage ends, and further, adding "1" of a decimal number to a count value after all bits are inverted.

13. The device according to claim 11, wherein the binary counter has a plurality of multi-stage connected one-bit counters corresponding to the number of bits of the count output,
the one-bit counter of the least significant bit in the one-bit counters including:
a first logical product gate circuit configured to take the logical product of the clock signal and an inverted control signal;
a selector gate circuit configured to supply with a normal signal an inverted signal of an output of the first logical product gate circuit, and to select and output either of the signals based on a selection signal;
a latch circuit configured to latch an output signal of the selector gate circuit based on an output signal of the converter; and
a register circuit configured to supply an output signal of the latch circuit, and to supply an output signal to the selector gate circuit as the selection signal,
one-bit counters, which are upper bit than the least significant bit in the one-bit counters including:
a flip-flop circuit having a data input terminal, a clock input terminal, a data output terminal and an inverted data output terminal, the inverted data output terminal and the data input terminal being connected; and
a second logical product gate circuit configured to supply with an inverted output signal of the latch circuit of the one-bit counter of the least significant bit an inverted control signal in a bit an upper one bit than the least significant bit, and to supply with a signal of the inverted data output terminal of the flip-flop circuit of a lower bit in a bit upper two bits than the least significant bit, and to take the logical product of the two input signals and to supply the logical product to the clock input terminal of the corresponding flip-flop circuit.

14. The device according to claim 13, wherein the control circuit configured to:
set each inversion control signal input to the first and second logical product gate circuits of the one-bit counter to logic "H" for a period when the comparator compares the first analog signal voltage with the first reference voltage;
change the inversion control signal input to the second logical product gate circuit of the one-bit counter of the most significant bit in the order of logic "L", logic "H" and logic "L" before a comparison of the second analog signal voltage with the second reference voltage is started after the comparison of the first analog signal voltage with the first reference voltage ends, and change the inversion control signal input to the second logical product gate circuit of the one-bit counter in the order of logic "L", logic "H" and logic "L" from upper bits over one-bit counters from the most significant bit to bits upper one bit than the least significant bit;
change the inversion control signal input to the first logical product gate circuit of the one-bit counter of the least significant bit to logic "L";
change the inversion control signal input to the second logical product gate circuit of the one-bit counter, which is an upper one bit than the least significant bit, to logic "H", and change the inversion control signal input to the second logical product gate circuit of a lower-bit one-bit counter to logic "H" over one-bit counter, which is upper two bits than the least significant bit to a one-bit counter of the most significant bit; and
change the inversion control signal input to the first logical product gate circuit of the one-bit counter of the least significant bit to logic "H", and invert a logic level of an output data of a flip-flop circuit of the one-bit counter after the comparison of the first analog signal voltage with the first reference voltage ends, and further, adding "1" of a decimal number to a count value after all bits are inverted.

* * * * *